(12) United States Patent  
Godfrey et al.

(10) Patent No.: US 9,117,721 B1  
(45) Date of Patent: Aug. 25, 2015

(54) REDUCED THICKNESS AND REDUCED FOOTPRINT SEMICONDUCTOR PACKAGING

(71) Applicant: Excelitas Canada, Inc., Vaudreuil-Dorion (CA)

(72) Inventors: Lawrence Allen Godfrey, Vaudreuil-Dorion (CA); Arthur John Barlow, Alton (GB)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 0 days.

(21) Appl. No.: 14/220,167

(22) Filed: Mar. 20, 2014

(51) Int. Cl.
| | |
|---|---|
| H01L 23/495 | (2006.01) |
| H01L 29/20 | (2006.01) |
| H01L 23/48 | (2006.01) |
| H01L 21/00 | (2006.01) |
| H01L 27/146 | (2006.01) |

(52) U.S. Cl.  
CPC ...... *H01L 27/14634* (2013.01); *H01L 27/1469* (2013.01)

(58) Field of Classification Search  
CPC ............. H01L 27/14634; H01L 27/1469; H01L 2924/10253  
USPC ........... 257/443, 668, 615, 774; 438/66, 667, 438/107, 614, 381, 672  
See application file for complete search history.

(56) References Cited

U.S. PATENT DOCUMENTS

| | | | |
|---|---|---|---|
| 2003/0230796 A1* | 12/2003 | Ismail et al. .................. 257/686 |
| 2005/0045692 A1* | 3/2005 | Harun et al. ............... 228/110.1 |
| 2007/0102801 A1* | 5/2007 | Ishida et al. .................. 257/686 |
| 2008/0116591 A1* | 5/2008 | Hayashi et al. ............... 257/784 |
| 2009/0321501 A1* | 12/2009 | Liang et al. ............... 228/180.5 |
| 2010/0295144 A1 | 11/2010 | Jackson et al. |

* cited by examiner

*Primary Examiner* — Long K Tran  
*Assistant Examiner* — Dzung Tran  
(74) *Attorney, Agent, or Firm* — Peter A. Nieves; Sheehan Phinney Bass & Green, PA

(57) ABSTRACT

Semiconductor devices and methods for forming semiconductor devices are presented. A device formed of a semiconductor material is configured to mount upon a substrate layer surface having a substrate layer wire attach pad. The device includes a top planar surface with an electrically active region, and a bottom planar surface disposed substantially parallel to the top planar surface. A shelf region is disposed between the top planar surface and the bottom planar surface, and a device wire attach pad in electrical communication with the active region is located on the shelf region.

18 Claims, 13 Drawing Sheets

REDUCED THICKNESS AND REDUCED FOOTPRINT SEMICONDUCTOR PACKAGING

FIELD OF THE INVENTION

The present invention relates to semiconductor devices, and more particularly, is related to fabrication of semiconductor devices facilitating wire bond pads facilitating reduced thickness and reduced area.

BACKGROUND OF THE INVENTION

The electrical connections between portions of semiconductor devices may be provided by wires attached to wire bond pads. For example, wire bonding may be used for making interconnections between an integrated circuit (IC) or another semiconductor device and its packaging during semiconductor device fabrication. Wire bonding may also be used to connect an IC to other electronics or to connect from one printed circuit board (PCB) to another. Wire bonding is generally considered to be a very cost-effective and flexible interconnect technology, and is used to assemble a majority of semiconductor packages.

Bond wires may be formed of one or more of several materials, for example, aluminum, copper, and gold. Bond wire diameters may be relatively small, for example, on the order of 15 μm, and may increase to several hundred micrometers, for example, for high-powered applications. Several techniques may be used to attach the bond wires to the bond pads, for example, ball bonding, wedge bonding, and compliant bonding. Ball bonding is generally reserved to gold and copper wire and usually requires heat. Wedge bonding can use either gold or aluminum wire, with only the gold wire requiring heat. In general, the wire is attached at both ends using some combination of heat, pressure, and/or ultrasonic energy to make a weld.

Wire bond pads currently use planar technology, resulting in the wire bond extending above the top layer of the semiconductor die being wire bonded. As shown by FIG. 1, wire bonding may be used to electrically connect electrical components on different layers of a multi-layer package 100. For example, a first wire bond pad 135 provides an electrical attachment surface for a photo sensor 150 on a first die layer 110 of the multi-layer package 100. A second wire bond pad 195 provides an electrical attachment surface for a second die layer or substrate layer 190 of the multi-layer package 100. The first wire bond pad 135 and the second wire bond pad 195 are electrically connected by a bond wire 170. The bonding of the bond wire 170 to the first bond pad 135 generally results in portions of the bond wire "loop" 190 extending significantly above the surface of the first bond pad 135, and likewise, above the top surface of the first die layer 110. This protrusion of the wire loop may impede full areal access over the wafer or die 110 by optics such as lenses, filters, encapsulation epoxies and compounds, scintillator crystals, and the like.

In some light detection applications, two or more silicon light-detection chips are placed side-by-side to form an array of light detectors. Examples of such light detecting arrays include medical imaging devices and astronomical telescope detectors. The light detecting array may include a matrix of chips, for example, a three-by-three array, or four-by four array. It may be desirable to pack the chips of this array is as closely as possible to maximize the light-detection active area relative to the mechanical dimensions of the array.

Photo detector chips generally have a chip outline or perimeter and an active detection area within the chip outline. Generally, a first electrical output connection connects to a chip die on the underside of the chip and a second electrical connection connects the chip to a specific contact area of a pad on the top side of the chip. The chips that form an array may be individually packaged and selected after testing, for example, based on certain performance specifications. The individual package includes a semiconductor chip bonded onto a substrate layer. This substrate can be a sub-mount for each chip that mounts to a second plate or tile for the array. Alternatively, the chip may mount directly to the substrate which is a single tile directly holding all of the chips in the array. In each of these examples, the chip is attached to its respective substrate using an electrically conductive bonding medium such as a backside contact, and a gold wire or similar bonding the chip top contact to another electrical contact area on the substrate. The substrate provides electrical tracking and contacts to an external device, so that each of the chips in the array can eventually be connected to suitable electronic systems nearby the detector array tile, such as amplifiers, bias voltage and voltage supplies, among others. The chip may then be over molded, for example, using an appropriate optically transparent epoxy compound, either individually on its sub-mount, or collectively with all the other chips on the tile, or both, once the surmounts are placed on their tile plate.

Typical chip layouts of this type may include an active area, an edge area and the area reserved for top-side contact pad. The top-side contact pad is typically 100 um in dimension, round, rectangular or square, with a thin bond wire ultrasonically welded to this pad. The other end of the wire may be bonded to the sub-mount or substrate adjacent to the pad. With this arrangement a relatively wide area of the surface must be allocated on the chip itself to fit this pad area next to the active area, and a corresponding wide area on the substrate for the wire. However, such an arrangement leaves a relatively high percentage of the chip array face area reserved for optically active area and for corresponding light radiation detection.

One solution for maximizing the active area to substrate surface area ratio is called a "Through-silicon via" or TSV, where the top-side contact is made by metallization tracks deposited on the silicon to the top end of a via-type metal or conductive contact "rod" synthesized within the silicon chip from top to bottom (the TSV). The contact to the substrate is then made through the bottom end of the via, possibly with metal contacts, for example, bump contacts, on the chip underside. The via may be placed under or next to the active area of the chip and thereby takes up little or no active area surface space, and yet allows the contact to top and bottom to occur more or less within the active area of the chip. Unfortunately, the TSV and bump contacts involve a complex and costly set of processes for silicon chip makers to perform and the processing of the silicon to form the vias and so forth can be detrimental to the operation of the photo-detector on the chip in any case.

Therefore, there is need in the industry to address at least some of the abovementioned shortcomings.

SUMMARY OF THE INVENTION

Embodiments of the present invention provide a reduced thickness and reduce area packaging design. Briefly described in architecture, the present invention is directed to a device having a semiconductor material configured to mount upon a substrate layer surface having a substrate layer wire attach pad. The device includes a top planar surface further having an electrically active region, a bottom planar surface disposed substantially parallel to the top planar surface, separated from the top planar surface by a device height, a shelf region disposed between the top planar surface and the bottom planar surface, the shelf region having a shelf surface having shelf height less than the device height, and a device wire attach pad in electrical communication with the active region. The device wire attach pad is at least partially disposed upon the shelf region, the bottom planar surface is configured to be disposed adjacent to the substrate layer, the bottom planar surface covers a portion of the substrate layer surface excluding the substrate layer wire attach pad, and the device is configured to be in electrical communication with the substrate layer via an electrical connection between the device wire attach pad and the substrate layer wire attach pad.

Briefly described, a second aspect of the present invention is a method of manufacturing a semiconductor device. Steps include forming a semiconductor wafer having a top planar surface, a bottom planar surface opposite the top planar surface, and a wafer perimeter edge, forming a shelf having a shelf surface in the wafer, the shelf surface disposed between the top planar surface and the bottom planar surface, and attaching a wafer wire attach pad to the shelf surface.

Briefly described, a third aspect of the present invention is a method for arranging a plurality of tiled semiconductor devices on a substrate layer. Steps include forming a plurality of semiconductor devices by forming a substantially rectangular semiconductor wafer having a top planar surface, a bottom planar surface opposite the top planar surface, and a wafer perimeter edge, forming a shelf having a shelf surface in the wafer, the shelf surface disposed in an edge of the rectangular wafer between the top planar surface and the bottom planar surface, removing a portion of the shelf to form an edge via, and attaching a wafer wire attach pad to the shelf surface. Other steps are attaching a first of the plurality of semiconductor devices to the substrate layer, attaching a second of the plurality of semiconductor devices to the substrate layer, wherein the edge via of the first device is adjacent to the edge via of the second device.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1:
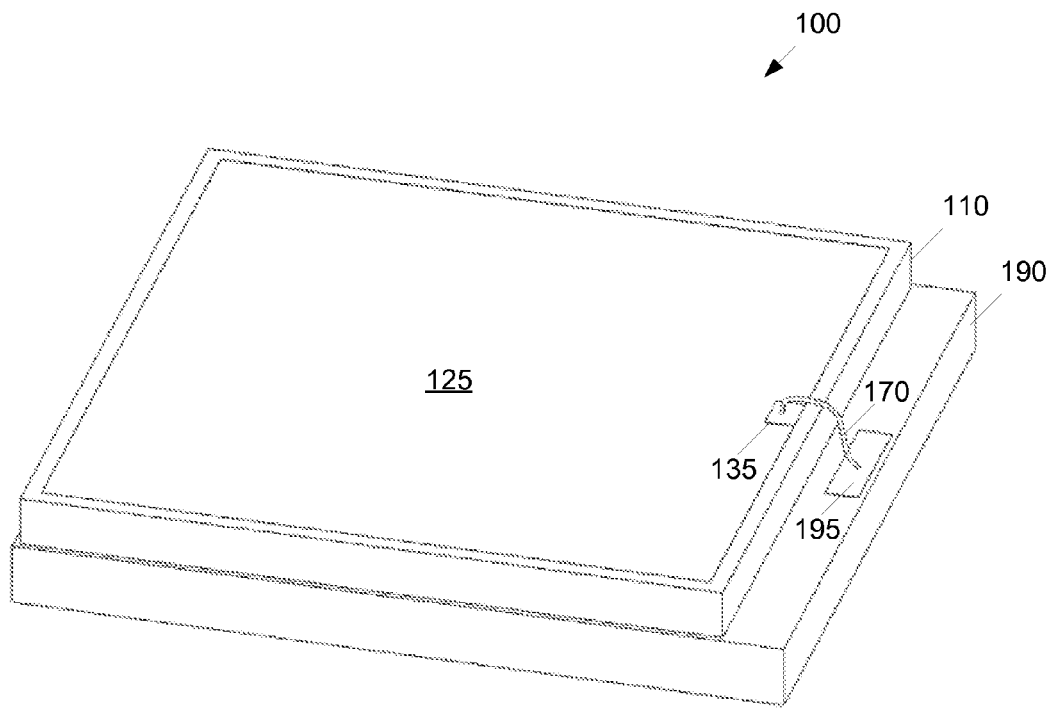
FIG. 1 is a schematic diagram of a prior art semiconductor assembly.

As used within this disclosure, "substantially" means, "very nearly," or generally within expected manufacturing tolerances. For example, substantially parallel is used to mean two planes that are parallel to within an acceptable tolerance, allowing for manufacturing variations. For example, a variation within one or two degrees may be considered substantially parallel for the purposes of this disclosure, as would a surface that deviates somewhat from being perfectly flat.

As used within this disclosure, "electrically active region" refers to a portion of a semiconductor device configured to be sensitive to electromagnetic radiation, for example, but not limited to, a photodiode or a thermopile, or a portion of a semiconductor device providing an electrical contact point to an electrical component mounted on or within the semiconductor device.

Reference will now be made in detail to embodiments of the present invention, examples of which are illustrated in the accompanying drawings. Wherever possible, the same reference numbers are used in the drawings and the description to refer to the same or like parts.

As noted above, prior art wire bond pads use planar technology, generally resulting in the bond wire loop rising significantly above the top layer of the semiconductor die or wafer being wire bonded. It is one of the objects of this invention to overcome this protrusion of the wire loop to allow full areal access over the wafer or die 110 by optics such as lenses, filters, encapsulation epoxies and compounds, scintillator crystals etc. The following presents exemplary embodiments of semiconductor dies having a bond pad on a lowered section of the die so that the height of the bond wire above the die is reduced. In some preferred embodiments, the wire bond is completely below the top surface of the die.

Figure 2A:
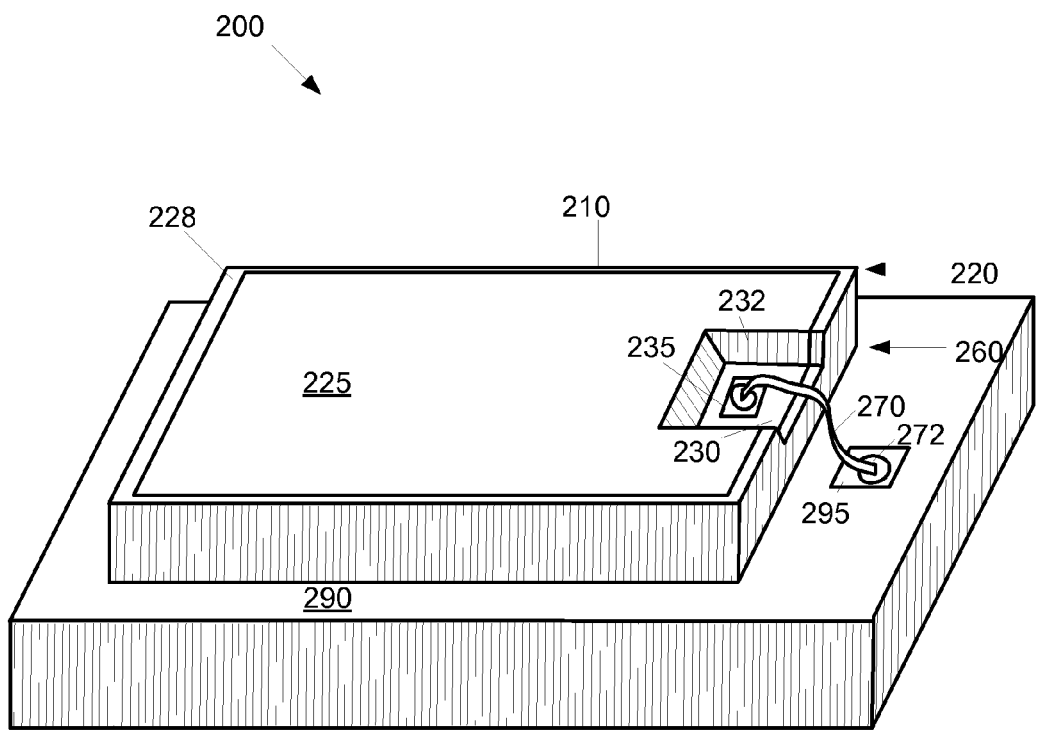
FIG. 2A is a schematic diagram of an exemplary first embodiment of a semiconductor device with a shelf with non-vertical shelf walls.
Figure 2B:
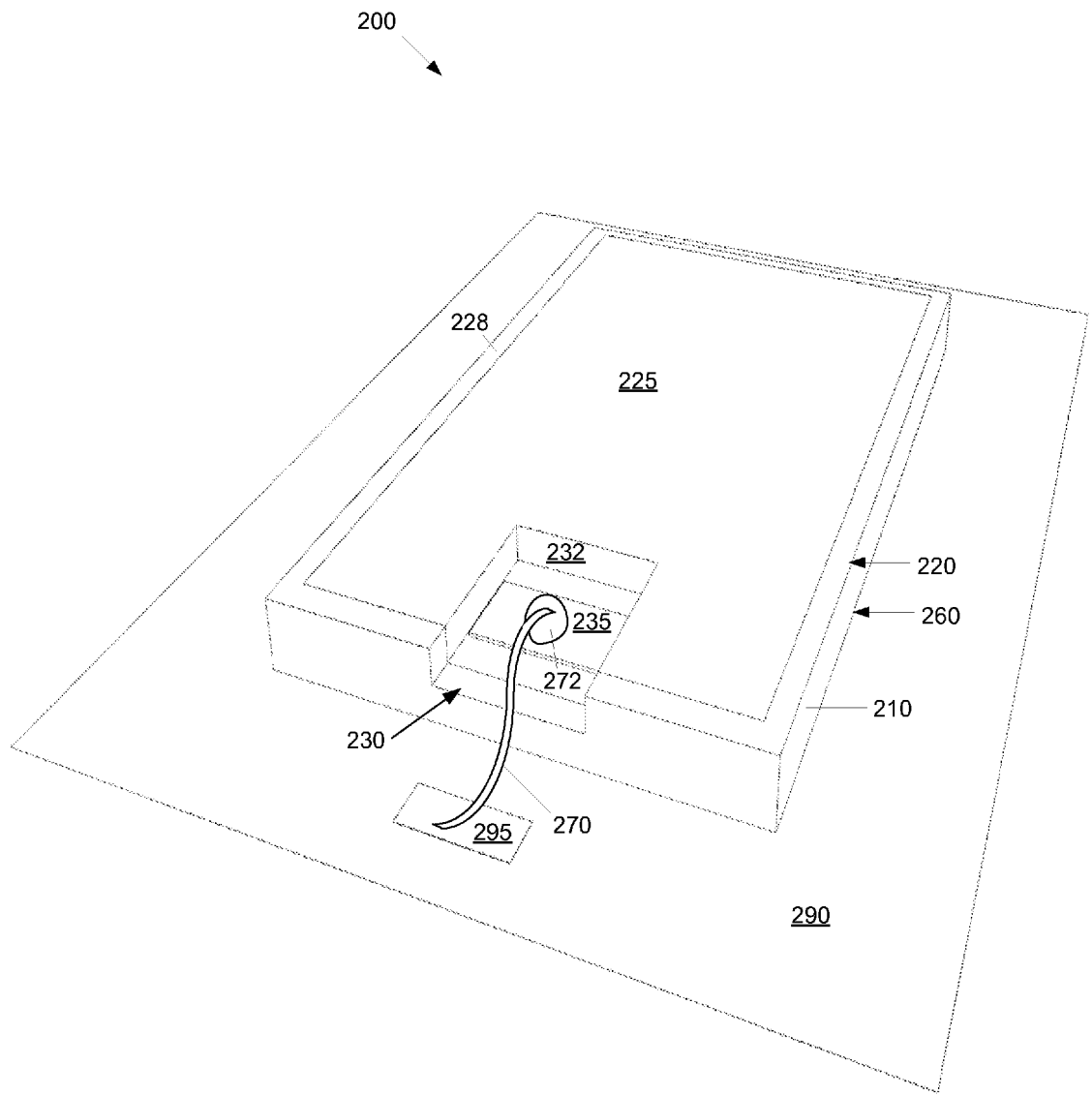
FIG. 2B is a schematic diagram of an exemplary first embodiment of a semiconductor device with a shelf with vertical shelf walls.

FIGS. 2A-2B show a first exemplary embodiment 200 of a semiconductor device according to the present invention. A first die or wafer 210 formed of a semiconductor material, for example, but not limited to silicon or gallium arsenide, has a top planar surface 220 and a bottom planar surface 260 substantially parallel to the top planar surface 220. The bottom planar surface 260 is bonded to a second die or substrate layer 290 and may include a backside electrical connection (not shown) to the substrate layer 290. The wafer 210 has a height defined by the distance from the top planar surface 220 to the bottom planar surface 260. The wafer 210 may include an active area 225, for example, a photo sensitive region that is substantially coplanar with the top planar surface 220. Alternatively, the active area 225 may be somewhat inset within the top planar surface 220, or the active area 225 may extend somewhat above the top planar surface 220. The active area 225 may be surrounded by a perimeter 228 that is substantially coplanar with the top planar surface 220. For example, the perimeter 228 may be formed of the material of the wafer 210, while the active area 225 is applied upon the wafer 210, or inset into the wafer 210. In alternative embodiments (not shown) active area 225 may include a partial perimeter 225, or may not include a perimeter at all.

A shelf 230 is formed in the wafer 210 by removing a portion of the top planar surface 220, for example, by etching a portion of the wafer 210 top planar surface 220. The shelf 230 may also be formed by other methods, for example, cutting or grinding away material from the wafer 210. In the first embodiment, the shelf 230 is substantially parallel to the top planar surface 220, and forms a surface region below the top planar surface 220 in relation to the bottom planar surface 260. The shelf 230 supports a device attach pad 235. The device attach pad 235 provides an electrical connection point to the active area 225.

A bond wire 270 is used to form an electrical connection between the wafer 210 top side and the substrate layer 290. The bond wire 270 is attached to the wafer 210 via the device attach pad 235, and the bond wire 270 is attached to the substrate layer 290 via the substrate layer attach pad 295. The attachment between the bond wire 270 and the device attach pad 235 is made with a bond material 272 using a wire bonding technique described above, for example, ball bonding, wedge bonding, and compliant bonding. The connection formed by the bonding material 272 of the bond wire 270 to the device attach pad 235 forms a loop in the wire 270 that raises the height of the wire 270 above the height of the shelf 230, for example, on the order of 50 to 100 μm above the surface of the shelf 230. Therefore, it is desirable to form the shelf 230 at a height sufficiently below the level of the top planar surface 220 such that the loop of wire 270 does not rise above or up to the level of the top planar surface 220, the object of this being to allow full surface contact to the active area 225 by other bodies, for example, optical lenses, filters or crystal scintillators.

Under the first embodiment, the shelf 230 includes a surface that is substantially parallel to the top planar surface 220. The shelf 230 includes a shelf wall 235 that may be oriented as substantially perpendicular to the shelf 230 and the top planar surface 220, as shown in FIG. 2B, or may be oriented at a non-vertical inclined angle, as shown in FIG. 2A. As described below, other orientations of the shelf 230 and/or shelf wall 232 with respect to the top planar surface 220 are possible.

Figure 3A:
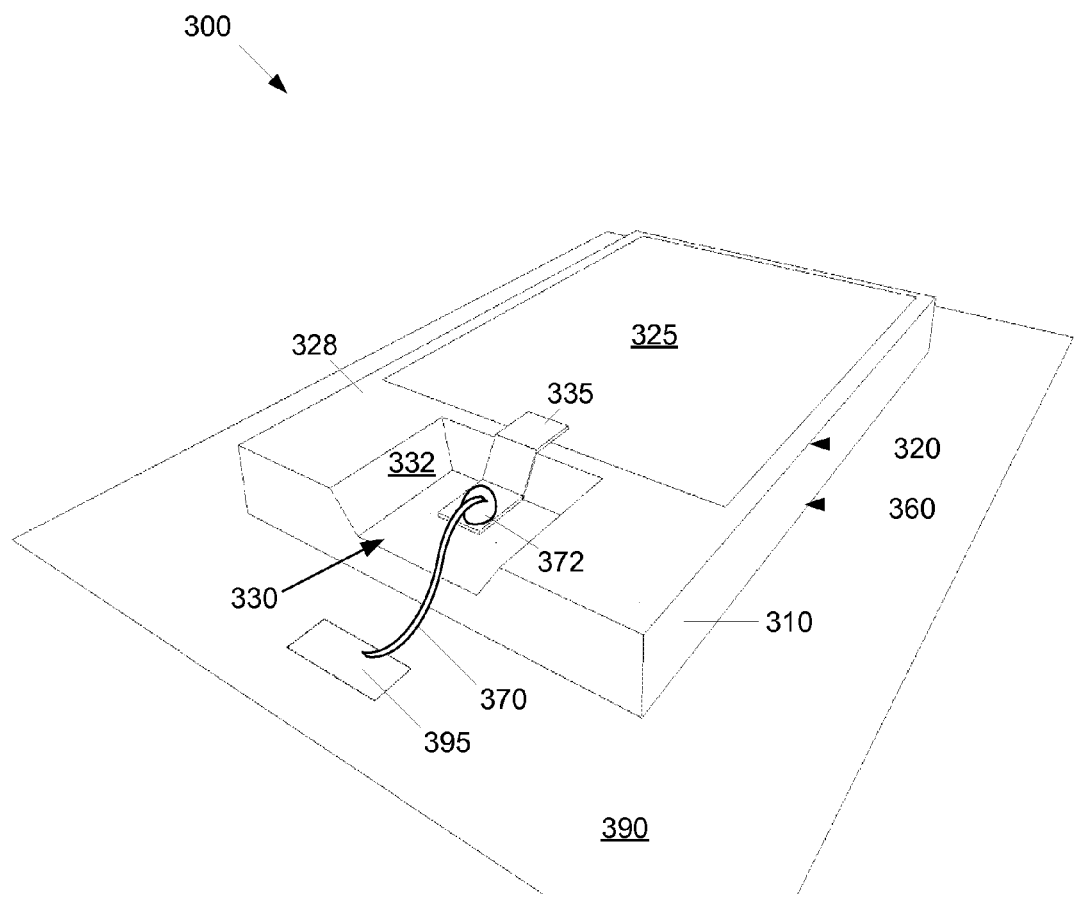
FIG. 3A is a schematic diagram of an exemplary second embodiment of a semiconductor device with a first variation split-level attach pad.

FIG. 3A shows a second exemplary embodiment of a semiconductor device 300 according to the present invention. A first die or wafer 310 formed of a semiconductor material, for example, but not limited to silicon or gallium arsenide, has a top planar surface 320 and a bottom planar surface 360 substantially parallel to the top planar surface 320. The bottom planar surface 360 is bonded to a second die or substrate layer 390. The wafer 310 has a height defined by the distance from the top planar surface 320 to the bottom planar surface 360. A shelf 330 is formed in the wafer 310, for example, by etching the wafer 310. The height of the shelf 330 above the bottom planar surface 360 is less than the height of the top planar surface 320. The wafer 310 may include an active area 325, for example, a photo sensitive region that is substantially coplanar with the top planar surface 320. The active area 325 may be surrounded by a perimeter 328 that is substantially coplanar with the top planar surface 320. As with the first embodiment, the active area 325 may be disposed somewhat above or below the top planar surface 320. For example, the perimeter 328 may be formed of the material of the wafer 310, while the active area 325 is applied onto the wafer 310, or inset into the wafer 310.

In contrast with the first embodiment, under the second embodiment the active area 325 does not extend into the shelf 330. The shelf 330 supports a device attach pad 335. The device attach pad 335 provides an electrical connection point to the active area 325, and extends along the shelf floor 330, upward along the shelf wall 332, across a portion of the perimeter 328, and into the active region 325. Such a device attach pad 335 may be referred to as a bi-level attachment pad or a split level attachment pad, as it has a first level attached to the shelf 330, a portion extending upward across the shelf wall 332, and a second level extending across the perimeter 328 to the active area 325. The attach pad 325 is formed with a thin surface configured to lie flat against the shelf 330 and/or the top planar surface 320. The attach pad 325 is formed of an electrically conductive material, for example, a copper alloy, among others. At least a portion of at least one surface of the device attach pad 335 may be electrically insulated, for example, by an electrically insulating material that insulates the attach pad 335 from the shelf 330 and/or the shelf wall 332, and/or the perimeter 328.

Figure 3B:
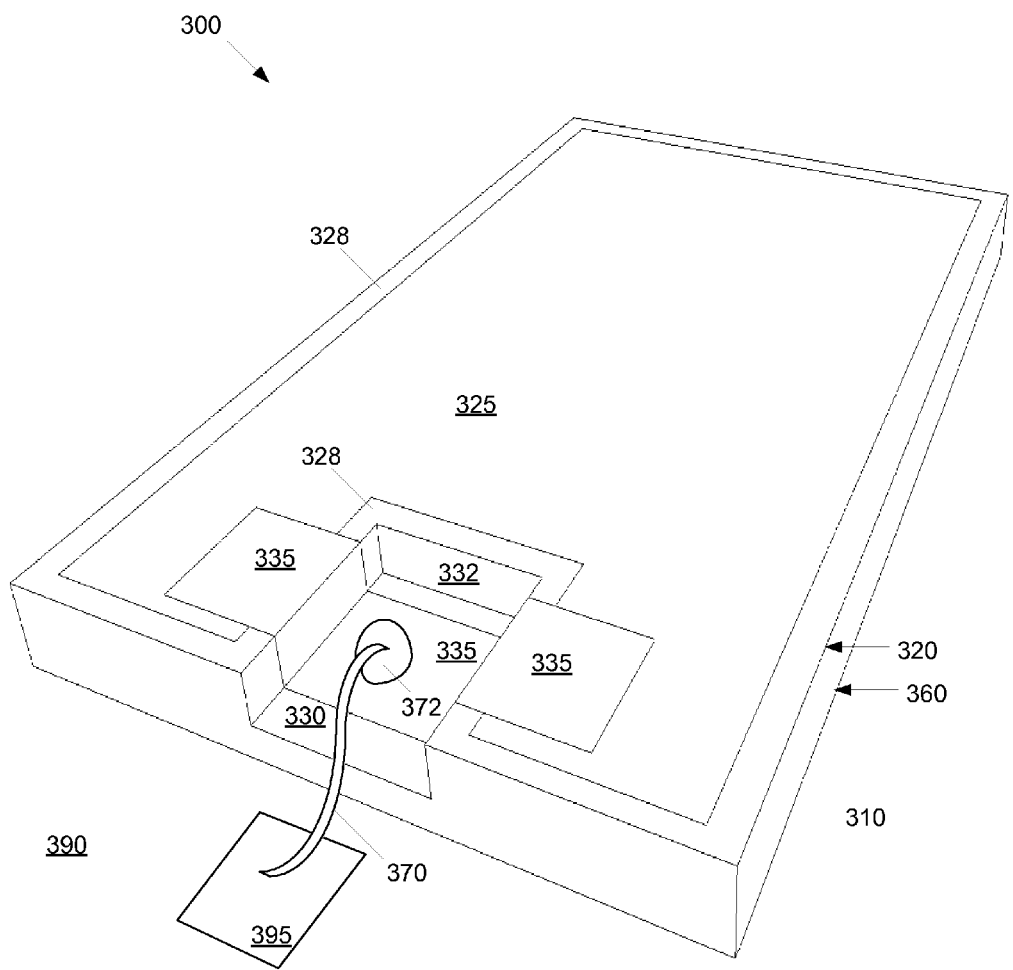
FIG. 3B is a schematic diagram of an exemplary second embodiment of a semiconductor device with a second variation split-level attach pad.

FIG. 3A depicts the device attach pad 335 as spanning at least a portion of the shelf 330, a shelf wall 332, and a portion of the active area 325, in order to form an electrical connection between the active area 325 and the device attach pad 335. In contrast, under the first embodiment, shown in FIGS. 2A-2B, since the active area 225 extends across the shelf 230 and the shelf wall 232, the device attach pad 235 may be located entirely upon the shelf 230. FIG. 3B shows a variation on the second embodiment where the device attach pad 335 as spanning at least a portion of the shelf 330, a shelf wall 332, and two portions of the active area 325.

Figure 3C:
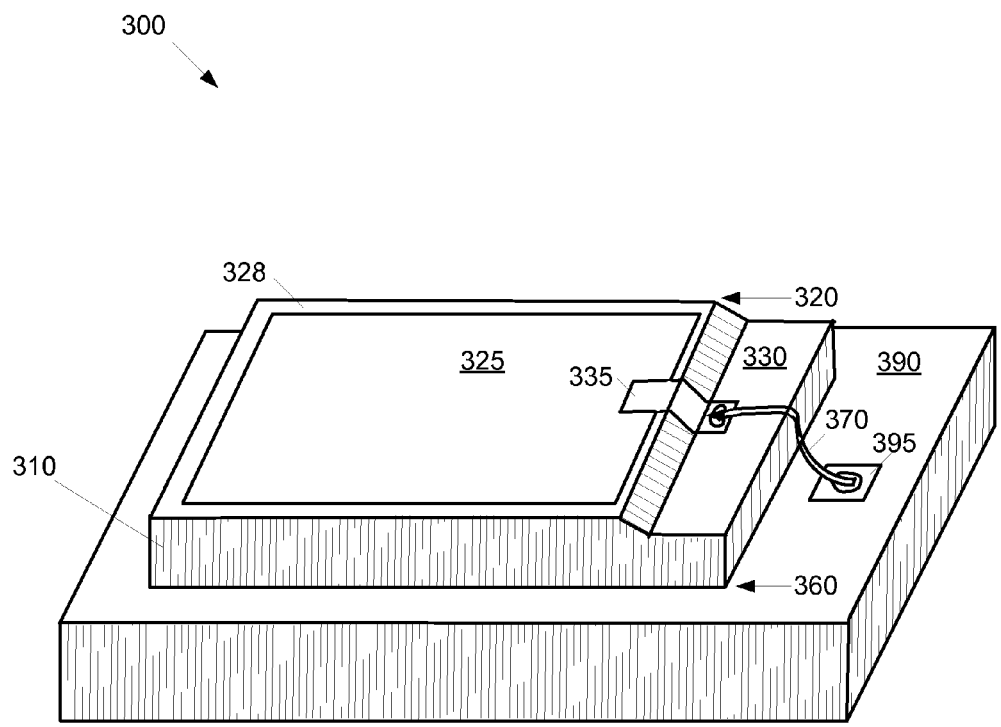
FIG. 3C is a schematic diagram of an alternative embodiment of the semiconductor device of FIG. 3A with an extended shelf.

While the first embodiment of FIG. 2B shows a shelf 230 with substantially vertical walls 232, and the second embodiment of FIG. 3A shows a shelf 330 with non-vertical walls 332, the configuration of the shelf walls is not exclusive to these embodiments. For example, regarding FIG. 2B, a wafer 210 having an active area 235 extending into the shelf region 230 may have vertical shelf walls 232, as shown, or non-vertical shelf walls as shown in FIG. 2A. Similarly, regarding FIG. 3A, a wafer 310 having an active area 335 separate from the shelf region 330 may have non-vertical shelf walls 332, as shown, or vertical shelf walls, as shown in FIG. 3B. Other configurations are also possible. For example, in an alternative embodiment shown in FIG. 3D, the shelf 330 may not be oriented parallel to the top planar surface 320, but instead the shelf 330 may be oriented at an incline with respect to the top planar surface 320 and the bottom planar surface 360. In such an alternative embodiment, the inclined shelf 330 may include one or more walls (not shown) extending from the top planar surface to the shelf surface, as shown in FIG. 3C, or the inclined shelf surface 330 may begin to drop off directly from the top planar surface.

Under the first and second embodiments, the shelf 230, 330 is formed as a substantially rectangular shaped recess formed along an edge of the wafer 210, 310. In alternative embodiments, the shelf 230, 330 may be a differently shaped recess formed along an edge of the wafer 210, 310, for example, a triangular shaped shelf, a semicircular shaped shelf, or a shelf with one or more curved walls. Instead of forming the shelf in a portion of a wafer edge, the shelf may be formed by reducing the height of the wafer 210, 310 along the entirety of one edge of the wafer 210, 310, as shown in FIG. 3C. In addition, as described below regarding the third and fourth embodiments below, the shelf may be formed to include two or more edges of the wafer 210, 310.

Figure 3D:
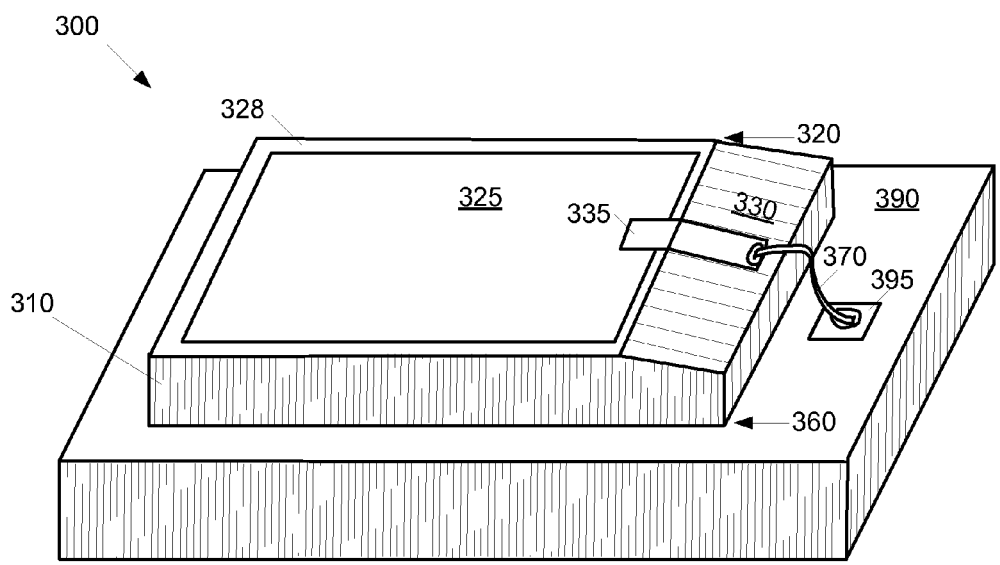
FIG. 3D is a schematic diagram of an alternative embodiment of the semiconductor device of FIG. 3A with an inclined shelf.

The pad shelf 330 has generally a relatively flat surface to facilitate attachment of the attachment pad 335. In preferred embodiments, the pad shelf surface is in a plane parallel to the plane of the first layer, however, there is no objection to non-parallel planes, for example, a pad shelf surface 330 oriented at an incline to the plane of the top planar surface 320, as shown in FIG. 3D. Such a device attach pad 335 may be referred to as an angled attachment pad, as it has a first portion attached to the inclined shelf 330, and a second portion extending across the perimeter 328 to the active area 325.

Figure 4:
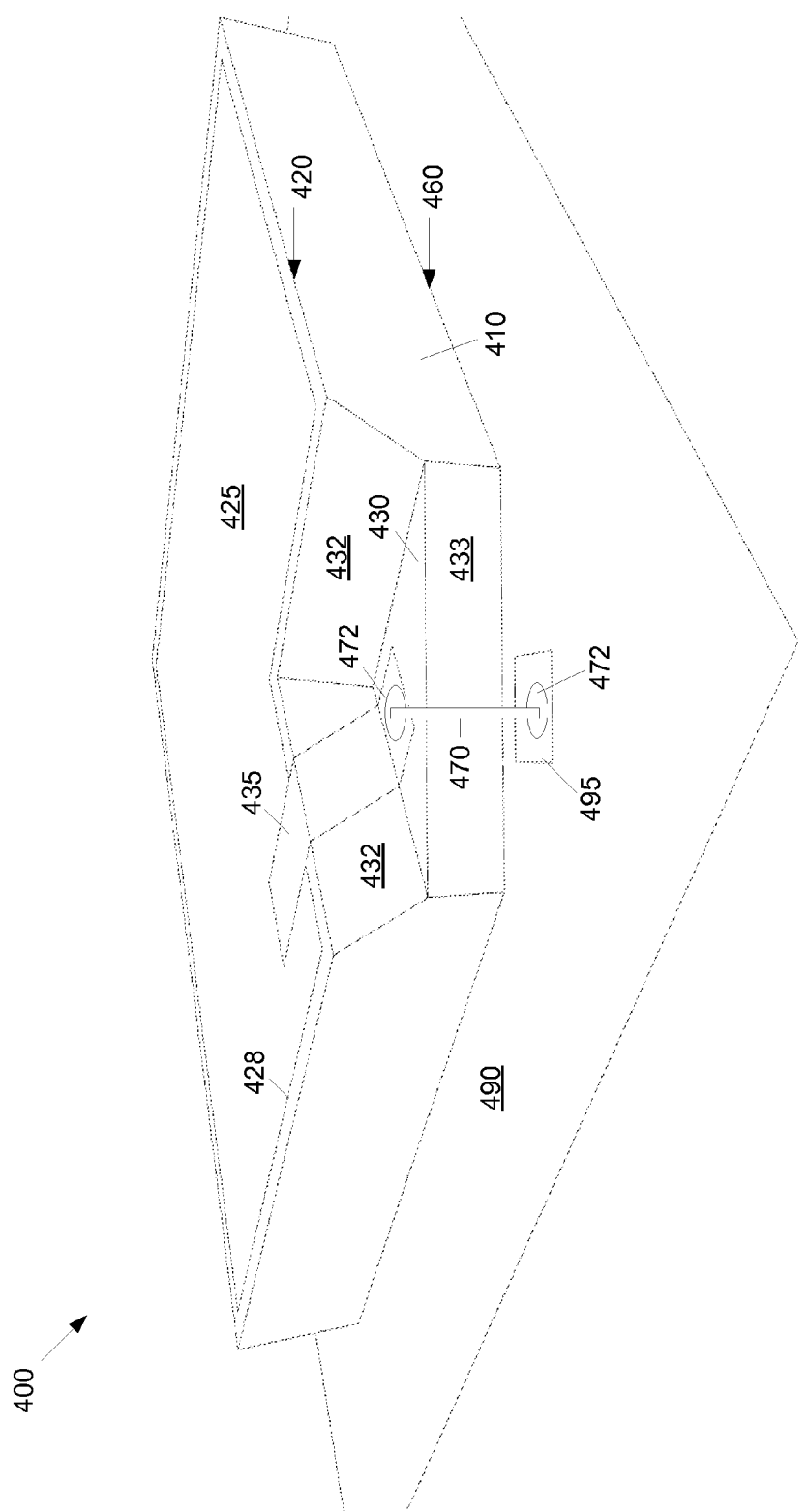
FIG. 4 is a schematic diagram of an exemplary third embodiment of a semiconductor device.
Figure 5A:
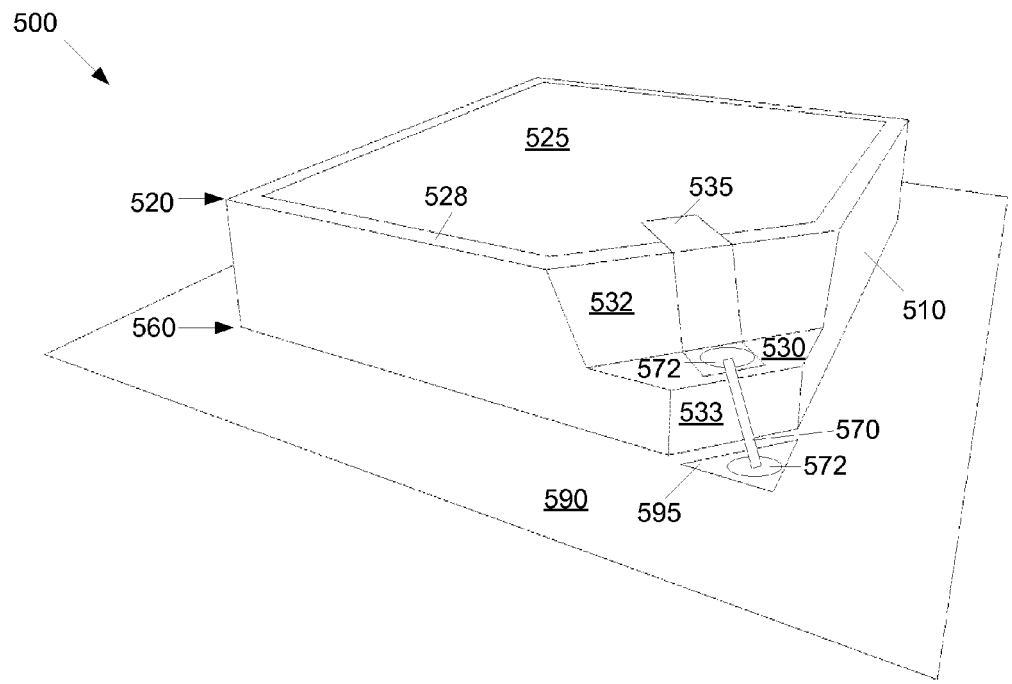
FIG. 5A is a schematic diagram of an exemplary fourth embodiment of a semiconductor device from a perspective view.
Figure 5B:
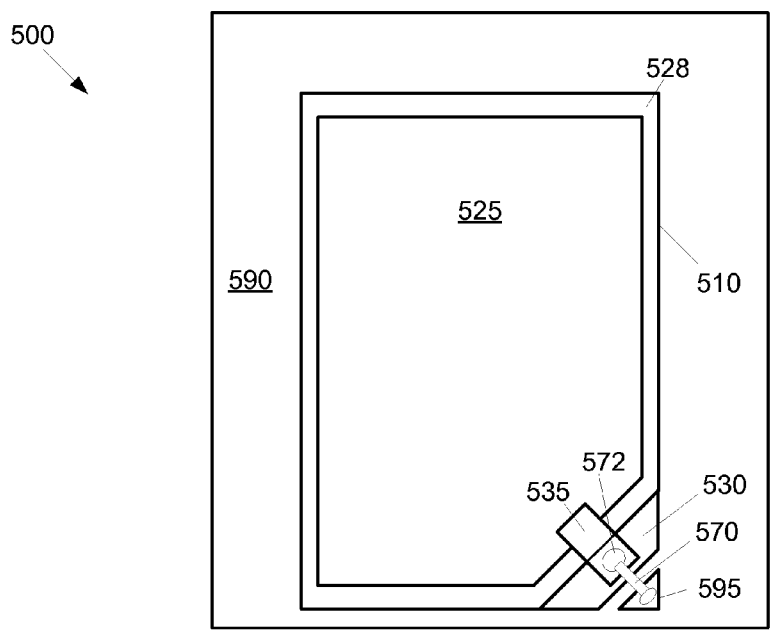
FIG. 5B is a schematic diagram of an exemplary fourth embodiment of a semiconductor device from a top view.

FIGS. 4 and 5A-5B show exemplary embodiments 400, 500 of a wafer 410, 510 with a shelf 430, 530 formed at a corner of the wafer 410, 510. The wafer 410, 510 has an active area 425, 525 in a top planar surface 420, 520 of the wafer 410, 510, and a perimeter 428, 528 surrounding the top planar surface 420, 520. The wafer 410, 510 has a bottom planar surface 460, 560 opposite the top planar surface 420, 520, and the shelf 430, 530 has a surface at a level between the top planar surface 420, 520 and the bottom planar surface 460, 560.

A corner via 433, 533 is formed, for example by removing a portion of the shelf 430, 530, typically prior to bonding the wafer 410, 510 to the substrate layer 490, 590, revealing a portion of the substrate layer 490, 590 in a region that otherwise would have been covered by the wafer 410, 510 had the corner via 433, 533 not been removed. A substrate layer attach pad 495, 595 is attached to the substrate layer 490, 590. The substrate layer attach pad 495, 595 may attached to the substrate layer 490, 590 in a portion of the substrate layer 490, 590 corresponding to the corner via 433, 533 region that otherwise would have been covered by the wafer 410, 510 had the corner via 433, 533 not been removed. A bond wire 470, 570 is bonded to the substrate layer attach pad 495, 595 with a wire bond 472, 572 and the bond wire 470, 570 is bonded to the device attach pad 435, 535, creating an electrical connection between the wafer 410, 510 and the substrate layer 495, 595.

In the third embodiment 400, the shelf 430 has two wall portions 432 that may be substantially perpendicular to one another. The device attach pad 435 is a split level pad, having a first level on the shelf 430 surface, a second level on the top planar surface 420 attaching to at least a portion of the active area 425 across the perimeter 428, and a connecting portion between the first level and the second level along at least one the shelf walls 432. The device attach pad 435 provides an electrical attachment point to the active area 425 at a location on the shelf 430, below the top planar surface 420.

In the fourth embodiment 500, the shelf 530 has a single wall portion 532 that is formed at an angle, for example, a substantially 45° to the edges of the wafer 500. The shelf 530 cuts off a corner portion of the top planar surface 520. The device attach pad 535 is a split level pad, having a first level on the shelf 530 surface, a second level on the top planar surface 520 attaching to at least a portion of the active area 525 across the perimeter 528, and a connecting portion between the first level and the second level along the diagonal shelf wall 532. The device attach pad 535 provides an electrical attachment point to the active area 525 at a location on the shelf 530, below the top planar surface 520.

While FIGS. 4 and 5A-B both depict wafers 410, 510 with active areas 425, 525 that do not extend into the shelves 430, 530, there is no objection to alternative embodiments where the wafers 410, 510 have active areas 425, 525 that do extend into the shelves 430, 530. In such alternative embodiments, the device attachment pads 435, 535 may not be bi-level attachments pads, but instead be single level attachment pads confined to the shelves 430, 530, and not extending across the shelf walls 432, 532, across the perimeters 428, 528 to the active areas 425, 525. In alternative embodiments, a wafer may be configured with a corner shelf without the corner via, so that the shelf extends to the full profile of the wafer corner, without removing a portion of the shelf to reveal a portion of the substrate layer.

Figure 6A:
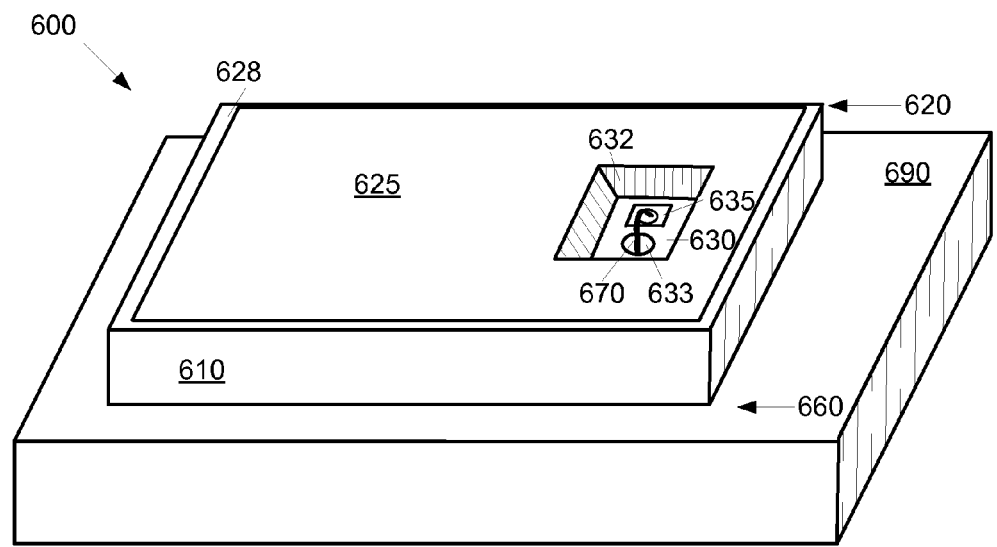
FIG. 6A is a schematic diagram of an exemplary fifth embodiment of a semiconductor device.
Figure 6B:
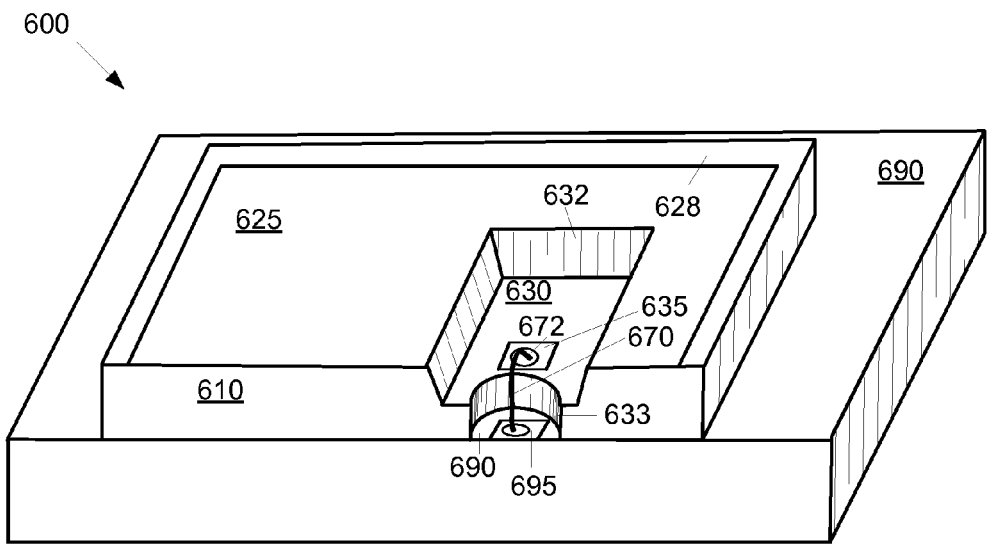
FIG. 6B is a schematic cutaway diagram the exemplary fifth embodiment semiconductor device of FIG. 6A.

Under a fifth exemplary embodiment, as shown by FIG. 6A, a shelf 630 is entirely inset within a top planar surface 620 of a first die 610. FIG. 6B shows a cutaway view of the semiconductor device 600 having an inset shelf 630. The inset shelf 630 is surrounded by a shelf wall 632. A through via 633 is formed though the surface of the shelf 630 to an attachment pad 695 on the surface of a second die 690, accessible by the through via 633. An active area 625 of the wafer 610 extends through the shelf 630, and a device attach pad 635 is located within the shelf 630. A bond wire 670 is attached to the device attachment pad 635 with a wire bond 672, as described above regarding the first embodiment. The bond wire 670 provides an electrical connection between the substrate attach pad 695 and the device attach pad 635.

In a variation of the fifth exemplary embodiment, the active area 625 does not extend to the shelf 630, and a split level attach pad (not shown) is used to form an electrical attachment between the active area 625 and the shelf 630.

An over mold encapsulant may be applied over the shelf and/or active layer in any of the abovementioned embodiments. The encapsulation may be formed of a transparent material applied as a resin, such as epoxy, which thereafter hardens to form a protective coating over the shelf and entire wafer 210, 310, 410, 510, 610. The encapsulant may be applied to all of the shelf, a portion of the shelf, or over all or a portion of the top planar surface. It is preferable that the encapsulant be applied to entirely cover any bond wire 270, 370, 470, 570, 670 attached to the device attach pad 235, 335, 435, 535, 635.

Other embodiments are possible. For example, the shelf and the device attachment pad on the shelf may be relocated to allow reduced die length, width or area, allowing for smaller package length, width, or area. For example, the overall chip size may be reduced for the same active area in comparison to the arrangement of the prior art attachment pad where the wire bond pad has to be moved well away from the active area so that an object can be attached directly to the active area.

Advantages of the above embodiments may include thinner packages, for example, surface mount photodiode for smart phone applications where the die needs a protective overcoat. Since this coat is preferably thick enough to encapsulate the wire bond, if the bond is lowered the thickness of the encapsulant may be consequently lowered, thereby reducing overall package thickness.

Such configurations may, for example, allow an X-ray responsive (scintillator) crystal to be attached directly to a light sensitive die for better coupling of the light from the crystal to the photodiode die. Similarly, such configurations may also allow optical filters to be attached directly to a light sensitive die for reduced overall height and reduced light leakage that occurs from light entering the gap between the filter and the die. These configurations may allow the die to be reduced in length, width or area without significantly compromising the sensitivity of the die to light. Therefore such object/die single entities may be mounted closer side by side for higher packing density and improved detection efficiency and/or reduced array packaging area, as described further below.

The shelf may be formed either before or after the photosensitive region is applied to the upper die. It may be advantageous to form the shelf before forming the photosensitive region, as a thin photosensitive region may then be applied, in comparison to forming a thicker photosensitive region which is then etched to form the pad shelf region.

As noted above, the height of the shelf is advantageously low enough below the top surface such that a loop of wire extending upward from a wire attach pad on the shelf is level with or below the height of the top surface. Accordingly, the difference in height between the shelf and the top surface is preferably on the order of at least 50-100 µm. Similarly, it is desirable that the thickness of the shelf is thin enough to accommodate the appropriate drop in elevation below the top surface, yet thick enough for mechanical stability, for example, on the order of at least 100-200 µm.

Figure 7:
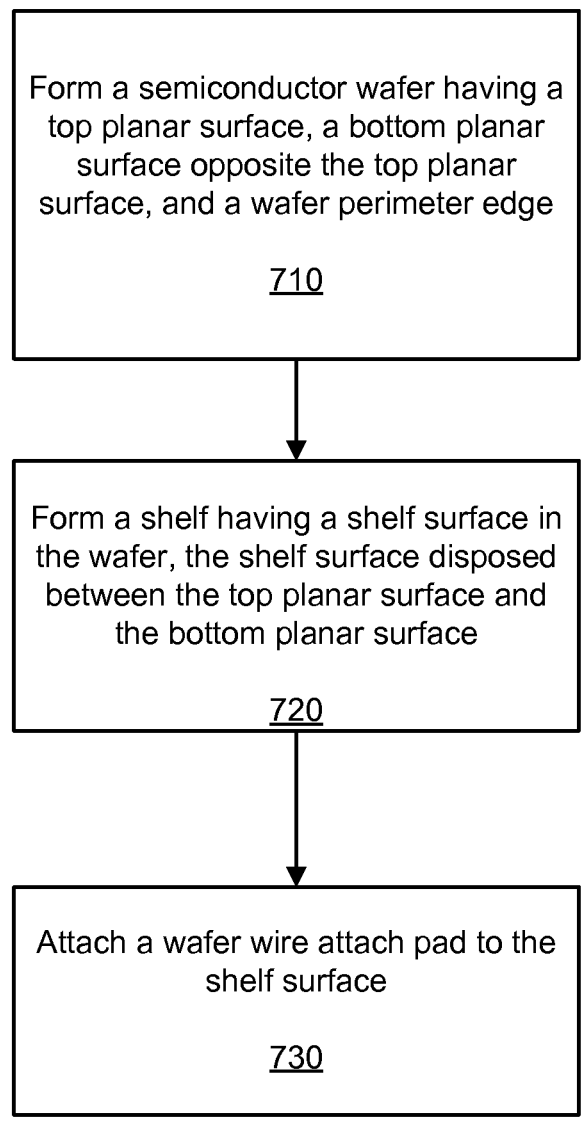
FIG. 7 is a flowchart of a method for arranging a plurality of semiconductor devices on a substrate.

A method for forming a semiconductor device is shown by the flowchart of FIG. 7. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A semiconductor wafer having a top planar surface, a bottom planar surface opposite the top planar surface, and a wafer perimeter edge is formed, as shown by block 710. A shelf having a shelf surface is formed in the wafer, the shelf surface disposed between the top planar surface and the bottom planar surface, as shown by block 720. A wafer wire attach pad is attached to the shelf surface, as shown by block 730.

Several of the abovementioned embodiments may be used to achieve higher packing density for array of chips. For example, some of the abovementioned embodiments provide a device and method for a chip having the chip corner cut off or otherwise removed in a corner area of the chip to minimize the area needed for wire bonding on the substrate layer, so that the area for the package may be significantly reduced. In these embodiments, the chip active area may extend as close to the chip edge as possible on all four sides of the chip, with the exception of the small edge or corner shelf area.

Figure 8:
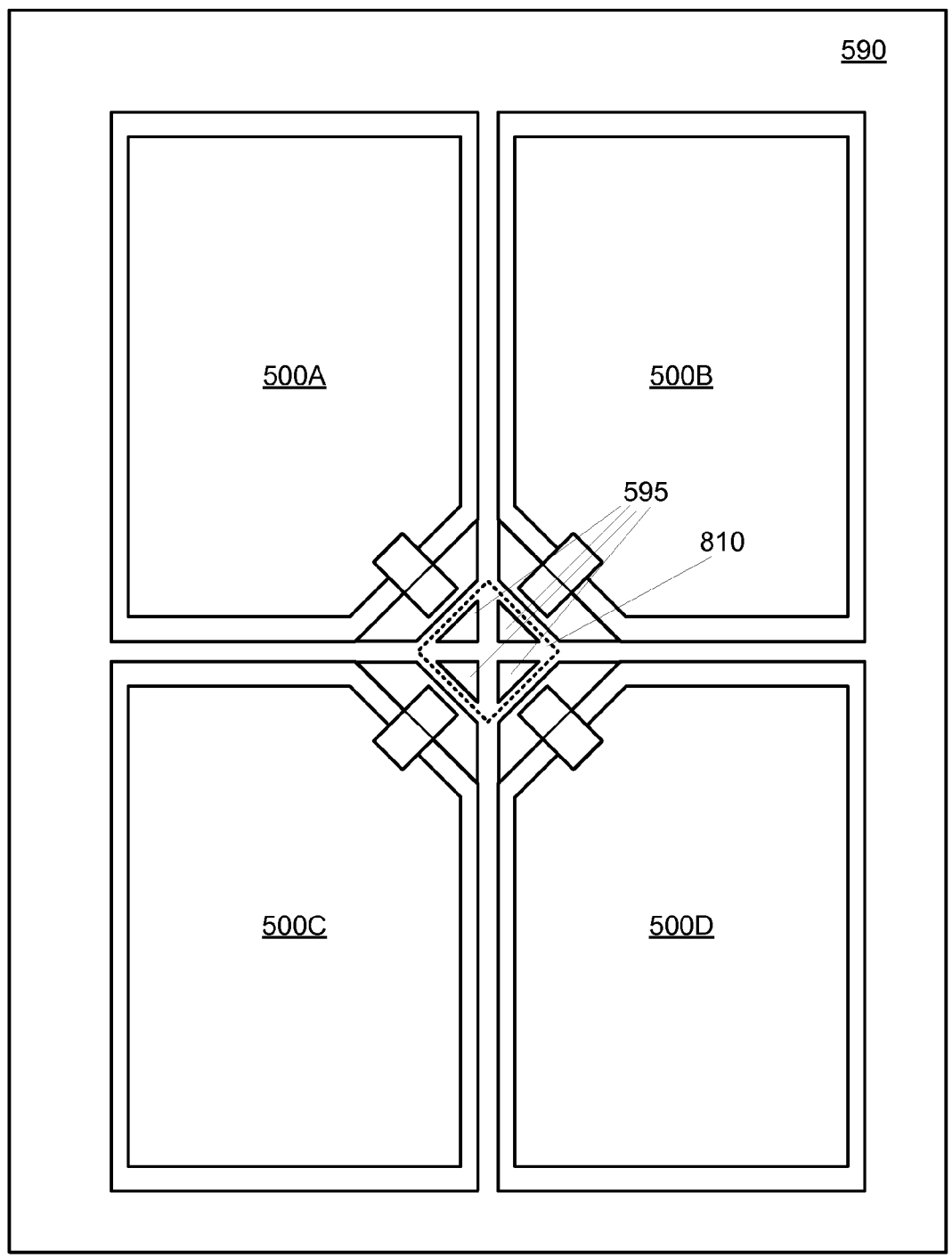
FIG. 8 is a schematic diagram of a tiling arrangement of devices of FIG. 5B on a substrate.

FIG. 8 shows an exemplary embodiment of an arrangement of four tiled semiconductor devices 500A-D with corner vias according to the fourth embodiment described above. The semiconductor devices 500A-D are arranged so that each has a corner via is co-located in a common via region 810, depicted with a dashed line. Each of the four semiconductor devices 500A-D has a corner via positioned in a different corner. The common via region 810 exposes the substrate layer 590. Four substrate layer attach pads 595 are attached to the substrate layer 590 within the common via region 810, such that the active region 525 (FIG. 5A) of each semiconductor device may be individually attached to a corresponding substrate layer attach pad 595. The electrical attachment of the active region 525 (FIG. 5A) may be formed by a device attach pad 535 (FIG. 5A) attached to a shelf 530 (FIG. 5A), using a bond wire (not shown), as described above. In alternative embodiments, two or more of the semiconductor devices 500A-D may be attached to a common substrate layer attach pad 595 in the common via region 810.

Other arrangements are possible. For example, embodiments may incorporate non-rectangular semiconductor devices, such that the non-rectangular semiconductor devices are arranged on a substrate layer such that five, six, or more corner vias converge within a common via region 810. Similarly, while FIG. 8 shows four semiconductor devices 500A-D with corner vias in the common via region 810, in alternative embodiments the common via region 810 may accommodate the corner vias of two or three semiconductor devices 500A-D.

This allows maximum light gathering area versus the mechanical tile dimensional area, resulting in better light detection ability and efficiency of the detector tile assembly. This reduces the area used for the wide bonding compared to the prior art, by using only the minimum required area for the bonding pads on chip and on substrate layer, for example, 100 um or 1 mm respectively, and not the entire edge of the chip as conventionally. This allows the detector active area to fill the chip area as much as possible.

Examples of semiconductor packages that may benefit from reduced area and/or reduced thickness include, but are not limited to arrays of sensors for imaging applications such as x-ray inspection systems, high energy physics experiments, Positron Emission Tomography medical systems, and consumer electronics where reducing thickness of components is critical to reducing overall thickness of the electronic devices.

Figure 9A:
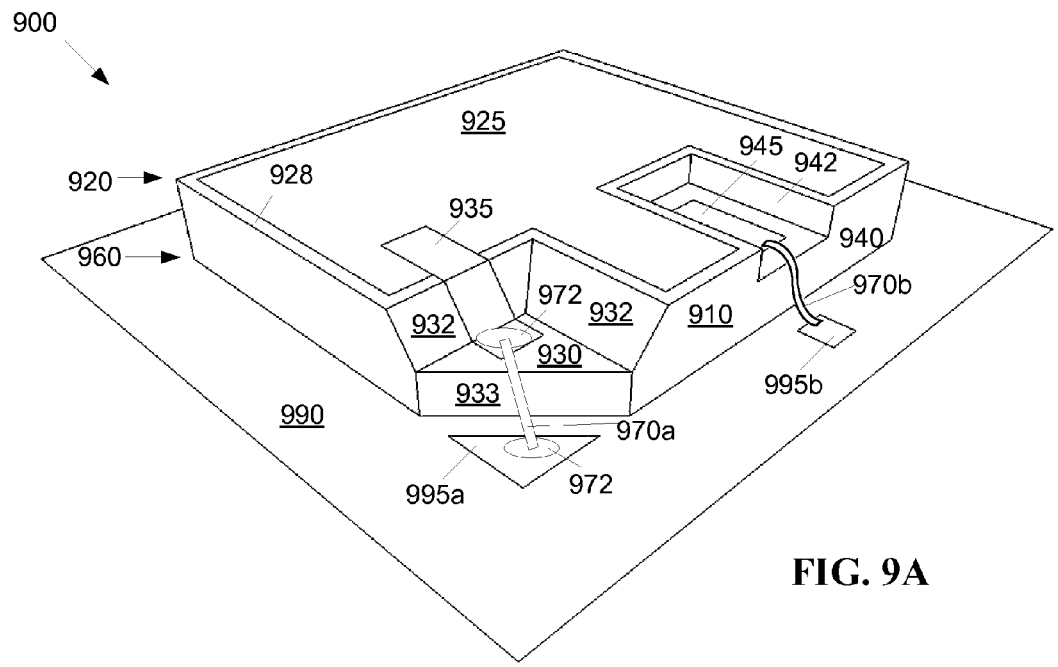
FIG. 9A is a schematic diagram of an exemplary eighth embodiment of a semiconductor device.

FIG. 9A is a schematic diagram of an exemplary eighth embodiment of a semiconductor device 900. A first die or wafer 910 formed of a semiconductor material has a top planar surface 920 and a bottom planar surface 960 substantially parallel to the top planar surface 920. The bottom planar surface 960 is bonded to a second die or substrate layer 990 and may include a backside electrical connection (not shown) to the substrate layer 990. The wafer 910 may include an active area 925 that is substantially coplanar with the top planar surface 920, may be somewhat inset beneath the top planar surface 920, or may protrude somewhat above the top planar surface 920. The active area 925 is optionally surrounded by a perimeter 928 that is substantially coplanar with the top planar surface 920.

A first shelf 930 is a corner shelf formed in the wafer 910 by removing a corner portion of the top planar surface 920, for example, by etching a portion of the wafer 910 top planar surface 920. The first shelf 930 supports a first device attach pad 935. The first device attach pad 935 provides an electrical connection point to the active area 925.

A first bond wire 970a may be used to form an electrical connection between the active area 925 and the substrate layer 990. The first bond wire 970a is attached to the wafer 910 at the first device attach pad 935. The first bond wire 970a is attached to the substrate layer 990 at a first substrate layer attach pad 995a, located on a portion of the substrate layer 990 exposed by a corner via 933. The attachment between the first bond wire 970a and the first device attach pad 935 is made with a bond material 972.

A second shelf 940 is an edge shelf formed in the wafer 910 by removing an edge portion of the top planar surface 920. The second shelf 940 supports a second device attach pad 945. The second device attach pad 945 provides a second electrical connection point, for example, to the active area 925, or to another portion of the wafer 910, or to another component (not shown) mounted on the wafer 910. For example, the second device attach pad 945 may be used in lieu of a backside attach point. As another example, a photodiode active region 925 may have both an anode contact and a cathode contact located on top of the wafer 910. Similarly, a wafer 910 with an array of junctions may include contacts for each junction on one, two, or more shelves.

A second bond wire 970b may be attached to the wafer 910 at the second device attach pad 945, forming an electrical connection to the second substrate layer attach pad 995b. The second bond wire 970b is attached to the substrate layer 990 at the second substrate layer attach pad 995b, located on a portion of the substrate layer 990 exposed by an edge via 943. Like the first bond wire 970a, the attachment between the second bond wire 970b and the second device attach pad 945 may made with a bond material (not shown).

Figure 9B:
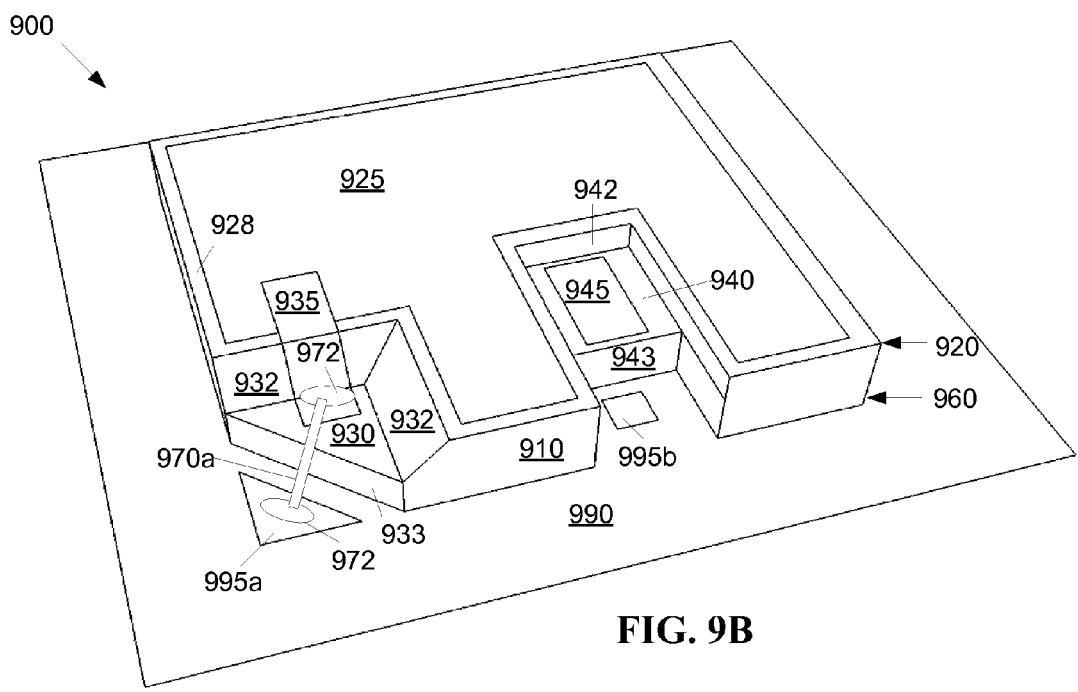
FIG. 9B is a schematic diagram of a variation of the exemplary eighth embodiment of a semiconductor device.

FIG. 9B is a schematic diagram of a variation of the exemplary eighth embodiment of a semiconductor device. This variation is substantially similar to the eighth embodiment, except the second shelf 940 includes an edge via 943. The edge via 943 removes a portion of the wafer 910 below the second shelf 940, so that when the wafer 910 is bonded to the substrate layer 990, a portion of the substrate layer 990 is revealed in the location where the edge via 943 was removed. Note, the second bond wire 970b is not shown in FIG. 9B.

Figure 10:
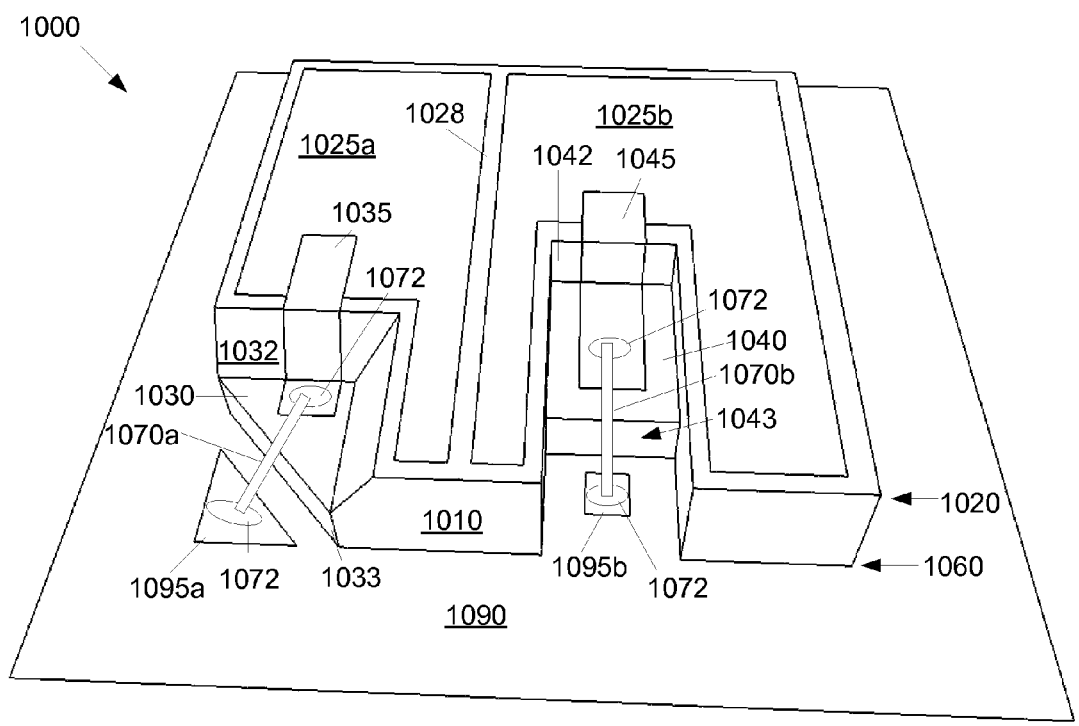
FIG. 10 is a schematic diagram of an exemplary ninth embodiment of a semiconductor device.

FIG. 10 is a schematic diagram of an exemplary ninth embodiment of a semiconductor device. The ninth embodiment is substantially similar to the variation of the eighth embodiment shown in FIG. 9B, with the addition of a second active area. A first die or wafer 1010 formed of a semiconductor material has a top planar surface 1020 and a bottom planar surface 1060 substantially parallel to the top planar surface 1020. The bottom planar surface 1060 is bonded to a second die or substrate layer 1090 and may include a backside electrical connection (not shown) to the substrate layer 1090.

The top planar surface 1020 of a wafer 1010 may include two or more active areas 1025a, 1025b, and each active area 1025a, 1025 may have an independent shelf 1030, 1040. The active areas 1025a, 1025b are surrounded by a perimeter 1028 that is substantially coplanar with the top planar surface 1020.

A first shelf 1030 is a corner shelf formed in the wafer 1010 by removing a corner portion of the top planar surface 1020, for example, by etching a portion of the wafer 1010 top planar surface 1020. The first shelf 1030 supports a first device attach pad 1035. The first device attach pad 1035 may provide an electrical connection point to the first active area 1025a.

A first bond wire 1070a is used to form an electrical connection between the wafer 1010, for example, the first active area 1025a, and the substrate layer 990. The first bond wire 1070a is attached to the wafer 1010 at the first device attach pad 1035. The first bond wire 1070a is attached to the substrate layer 1090 at a first substrate layer attach pad 1095a, located on a portion of the substrate layer 1090 exposed by a corner via 1033. The attachment between the first bond wire 1070a and the first device attach pad 1035 may be made with a bond material 1072.

A second shelf 1040 is an edge shelf formed in the wafer 1010 by removing an edge portion of the top planar surface 1020. The second shelf 1040 supports a second device attach pad 1045. The second device attach pad 1045 provides a second electrical connection point, for example, to the second active area 1025b, or to another portion of the wafer 1010, or to another component (not shown) mounted on the wafer 1010. For example, the second device attach pad 1045 may be used in lieu of a backside attach point.

A second bond wire 1070b may be attached to the wafer 1010 at the second device attach pad 1045, forming an electrical connection to the second substrate layer attach pad 1095b. The second bond wire 1070b is attached to the substrate layer 1090 at the second substrate layer attach pad 1095b, located on a portion of the substrate layer 990 exposed by an edge via 943. Like the first bond wire 970a, the attachment between the second bond wire 970b and the second device attach pad 945 may made with a bond material 1072. While the above embodiments have each had a single attach pad located per shelf, there is no objection to a shelf accommodating two, three or more attach pads, for example, to connect to two or more active regions, or to other components. Other alternative embodiments may include two or more shelves co-located along a single edge of a wafer, two or more corner shelves, two or more inset shelves, or combinations of one or more of an edge shelf, a corner shelf, and/or an inset shelf.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device comprising a semiconductor material configured to mount upon a substrate layer surface having a substrate layer wire attach pad, comprising:
    a top planar surface further comprising an electrically active region;
    a bottom planar surface disposed substantially parallel to the top planar surface, separated from the top planar surface by a device height;
    a shelf region disposed between the top planar surface and the bottom planar surface, the shelf region having a shelf surface having shelf height less than the device height; and
    a device wire attach pad in electrical communication with the active region;
    wherein the device wire attach pad is at least partially disposed upon the shelf region, the bottom planar surface is configured to be disposed adjacent to the substrate layer, the bottom planar surface covers a portion of the substrate layer surface excluding the substrate layer wire attach pad, and the device is configured to be in electrical communication with the substrate layer via an electrical connection between the device wire attach pad and the substrate layer wire attach pad.

2. The device of claim 1, wherein the top planar surface further comprises a perimeter at least partially surrounding the active region.

3. The device of claim 1 wherein the shelf surface is substantially parallel to the top planar surface.

4. The device of claim 3, further comprising a shelf wall spanning between the shelf surface and the top planar surface along at least a portion of the shelf region.

5. The device of claim 3, wherein the shelf wall is substantially perpendicular to the top planar surface and the shelf surface.

6. The device of claim 2, wherein the shelf region is formed at least partially within the perimeter region.

7. The device of claim 6, wherein the device wire attach pad spans between at least a portion of the top planar surface and at least a portion of the shelf region.

8. The device of claim 2, wherein the active region spans both the top planar surface and the shelf region.

9. The device of claim 1, wherein the top planar surface is substantially rectangular.

10. The device of claim 9, wherein the substrate layer wire attach pad is exposed by removal of a portion of the shelf.

11. The device of claim 10, wherein the shelf is disposed substantially in a corner of the top planar surface.

12. The device of claim 11, wherein the shelf region is substantially rectangular prior to removal of the portion to expose the substrate layer wire attach pad.

13. The device of claim 11, wherein the shelf region is substantially triangular prior to removal of the portion to expose the substrate layer wire attach pad.

14. The device of claim 10, wherein the portion the shelf removed to expose the substrate layer wire attach pad comprises a via through the device.

15. The device of claim 10, wherein the shelf region is a curved shape.

16. The device of claim 9, wherein the shelf is disposed substantially along one edge of the first planar surface, excluding at least one corner of the first planar surface.

17. The device of claim 2, further comprising an optically transparent over mold disposed to encapsulate the shelf and the device wire attach pad.

18. The device of claim 17, wherein the over mold is further disposed to encapsulate at least a portion of the first planar surface.

* * * * *